United States Patent
Dispenza et al.

(10) Patent No.: US 11,733,336 B2
(45) Date of Patent: Aug. 22, 2023

(54) METHOD FOR ACQUIRING MR DATA OF AN OBJECT UNDER EXAMINATION BY MEANS OF AN MR SYSTEM

(71) Applicant: Siemens Healthcare GmbH, Erlangen (DE)

(72) Inventors: Nadine Dispenza, Erlangen (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/485,883

(22) Filed: Sep. 27, 2021

(65) Prior Publication Data

US 2022/0099777 A1  Mar. 31, 2022

(30) Foreign Application Priority Data

Sep. 28, 2020  (DE) .......................... 102020212166.4

(51) Int. Cl.
*G01V 3/00*  (2006.01)
*G01R 33/561*  (2006.01)
(Continued)

(52) U.S. Cl.
CPC ....... *G01R 33/5617* (2013.01); *G01R 33/543* (2013.01); *G01R 33/56554* (2013.01)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

| 6,441,613 B1* | 8/2002 | Rosenfeld | ................ H02G 7/20 324/307 |
| 2004/0008027 A1* | 1/2004 | Prammer | ................. G01V 3/32 702/6 |

(Continued)

FOREIGN PATENT DOCUMENTS

DE   102012212983 B3   1/2014

OTHER PUBLICATIONS

Park, Jaeseok et al: "Reduction of B1 sensitivity in selective single-slab 30 turbo spin echo imaging with very long echo trains"; Magnetic Resonance in Medicine: An Official Journal of the International Society for Magnetic Resonance in Medicine, 2009; vol. 62, No. 4, pp. 1060-1066.

(Continued)

Primary Examiner — Walter L Lindsay, Jr.
Assistant Examiner — Frederick Wenderoth
(74) Attorney, Agent, or Firm — Banner & Witcoff Ltd.

(57) ABSTRACT

A method a for acquiring magnetic resonance data of an object under examination by means of a magnetic resonance system comprises: in an excitation phase, applying an RF excitation pulse; in a wait phase following the excitation phase, applying at least one first RF refocusing pulse after the applied RF excitation pulse according to a first echo spacing; in an acquisition phase following the wait phase, applying at least two further RF refocusing pulses to generate echo signals according to a second echo spacing, wherein the second echo spacing is smaller than the first echo spacing; and reading out the echo signals generated in the acquisition phase as magnetic resonance data from which image data can be reconstructed, wherein in the wait phase at least two spoiler gradients are switched in the readout direction.

11 Claims, 2 Drawing Sheets

(51) Int. Cl.
*G01R 33/54* (2006.01)
*G01R 33/565* (2006.01)

(58) Field of Classification Search
USPC .......................................................... 324/309
See application file for complete search history.

(56) References Cited

U.S. PATENT DOCUMENTS

| | | | | |
|---|---|---|---|---|
| 2004/0059213 | A1* | 3/2004 | Kassai | G01R 33/5673 600/410 |
| 2004/0140800 | A1* | 7/2004 | Madio | G01V 3/32 324/306 |
| 2010/0253343 | A1* | 10/2010 | Kim | G01R 33/4838 324/309 |
| 2013/0088228 | A1* | 4/2013 | Feiweier | G01R 33/4838 324/309 |
| 2014/0028313 | A1 | 1/2014 | Paul | |
| 2015/0285881 | A1* | 10/2015 | Ott | G01R 33/5608 324/309 |
| 2015/0293202 | A1* | 10/2015 | Feiweier | G01R 33/565 324/309 |

OTHER PUBLICATIONS

Feinberg D.A., Hoeninnger J.C., Crooks L.E., Kaufman L., Watts J.C., Arakawa M., "Inner volume MR imaging: technical concepts and their application"; Radiology 156, 743-747; 1985.

Mugler III, John P.: "Optimized three-dimensional fast-spin-echo MRI"; Journal of magnetic resonance imaging, 2014, vol. 39, No. 4, pp. 745-767.

Office Action dated Aug. 10, 2021 for German Patent Application No. 102020212166.4.

* cited by examiner

METHOD FOR ACQUIRING MR DATA OF AN OBJECT UNDER EXAMINATION BY MEANS OF AN MR SYSTEM

TECHNICAL FIELD

The disclosure relates to a method of acquiring magnetic resonance data of an object under examination by means of a magnetic resonance system whereby artifacts, in particular FID and flow artifacts, are eliminated.

BACKGROUND

Magnetic resonance technology (hereinafter referred to as MR for short) is a well-known technique for generating images of the interior of an object under examination. In simple terms, the object under examination is positioned in a magnetic resonance device in a comparatively strong, static, homogeneous main magnetic field, also known as a $B_0$ field, with field strengths of 0.2 to 7 tesla or more, so that its nuclear spins are oriented along the main magnetic field. To trigger nuclear spin resonances that can be measured as signals, radiofrequency excitation pulses (RF pulses) are applied to the object under examination, the nuclear spin resonances triggered are measured as so-called k-space data, and MR images are reconstructed or spectroscopy data is determined on the basis thereof. For spatial encoding of the measurement data, rapidly switched magnetic gradient fields, called gradients for short, are superimposed on the main magnetic field. The acquired measurement data is digitized and stored as complex numerical values in a k-space matrix. From the k-space matrix populated by values, an associated MR image can be reconstructed, e.g., by means of a multidimensional Fourier transform.

For a specific measurement, a pulse sequence comprising a radiofrequency (RF) pulse train to be transmitted and a train of gradients to be switched in a coordinated manner thereto (with matching gradients in the slice selection direction, in the phase encoding direction and in the readout direction) must be transmitted. The timing within the sequence is particularly important for imaging, i.e., which RF pulses and gradients follow one another at which intervals. A large number of the control parameter values are usually defined in a so-called measurement protocol, which is created in advance and can be retrieved for a specific measurement, e.g., from a memory, and, if necessary, modified by the operator locally, who can specify additional control parameter values, such as a specific slice spacing of a stack of slices to be measured, a slice thickness, etc. Based on all these control parameter values, a magnetic resonance control sequence is then calculated, which is also referred to as a measurement sequence, "MR sequence" (magnetic resonance sequence) or just "sequence" for short.

In conventional approaches, images of the interior of the object under examination are acquired slice by slice. In each case, a relatively thin slice, usually between 1 and 5 mm, is selectively excited. Selective excitation of this kind is achieved by applying a gradient in the slice selection direction in a coordinated manner with an injected RF excitation pulse. Such a pulse arrangement (consisting of the RF excitation pulse and the associated gradient) ensures that the RF pulse acts only selectively on the area determined by the gradient and the RF pulse. In most cases, this slice selection direction is parallel to the so-called z-axis, the longitudinal axis of the magnetic resonance system, or also to the longitudinal axis of a patient positioned in the magnetic resonance system. Spatial encoding within a slice is then performed, on the one hand by phase encoding in a direction perpendicular to the slice selection direction (usually the y-direction) and by readout encoding in the second direction perpendicular to the slice selection direction (usually the x-direction). In this way, a two-dimensional frequency space, the so-called k-space, can be filled by entering the measured scan data as raw data at the corresponding k-space points. A two-dimensional Fourier transform can then be used to generate an image of the slice.

It is also possible to excite larger three-dimensional volumes and measure them in a 3D process. Here, instead of a thin slice, a relatively thick slice (usually called a "slab") is excited in an excitation process. However, these slabs, usually more than 10 mm thick, must be measured again in a spatially resolved manner in the slice selection direction when acquiring the raw data. This is usually done by a second phase encoding, i.e., in this method, phase encoding is performed in two directions and readout encoding is performed in one direction in order to fill a three-dimensional k-space with raw data and generate a three-dimensional image volume therefrom by means of a 3D Fourier transform.

For example, the SPACE sequence ("Sampling Perfection with Application optimized Contrasts using different flip angle Evolutions"; also called "CUBE" or "VISTA") allows high-resolution three-dimensional (3D) images to be created in a short time. The SPACE sequence is a 3D turbo spin echo (TSE) sequence with application-specific variable flip angles that allow long echo train lengths.

Since the phase encoding steps during the measurement essentially determine the total acquisition time for the raw data, on the one hand it is advantageous to minimize the number of phase encoding steps required. On the other hand, the k-space must be covered sufficiently tightly (i.e., there must be sufficient sampling), otherwise aliasing foldovers could occur. Thus, to sample densely enough, the length of the volume to be excited must be as short as possible in each of the phase-encoding directions, wherein the volume should completely cover the object in the spatial domain. In the slice selection direction, the volume is defined by the boundaries of the slab, i.e., the selection of the first pulse arrangement can determine the slab thickness and therefore the volume length to be covered by the phase encoding in the slice selection direction. However, in the second phase encoding direction perpendicular to the slice selection direction, the entire object width must normally be taken into account. In order to limit the width in this direction also, it has been proposed that, after the first pulse arrangement with the RF excitation pulse selectively acting in the slice selection direction, another pulse arrangement selectively acting in a second direction is transmitted, namely a refocusing pulse with gradients switched accordingly in the second direction. This method, also referred to as "inner-volume refocusing", is described, for example, in D. A. Feinberg, J. C. Hoenninger, L. E. Crooks, L. Kaufman, J. C. Watts, and M. Arakawa, "Inner volume MR imaging: technical concepts and their application," Radiology 156, 743-747, 1985.

Thus, a visual volume is selectively limited in two directions, which already allows improvements to be achieved in terms of artifacts or foldovers despite a reduction in phase encoding steps in the two directions. However, flow-related artifacts can also occur, e.g., in spinal imaging due to cerebral spinal fluid (CSF) flowing into and/or out of the scanning volume. To prevent this, dephasing can be applied in the readout direction shortly before the echo train.

In addition, parts of an unwanted FID (free induction decay) signal which can result e.g., from the use of nonslice-selective refocusing pulses with flip angles of less than 180°, as is commonly used for SPACE-like sequences, may be measured overlaid with wanted spin echo signals, resulting in so-called FID artifacts.

SUMMARY

An object of the disclosure is to allow measurement of magnetic resonance data that is as insensitive as possible to both flow artifacts and FID artifacts.

This object is achieved by a method for acquiring magnetic resonance data, a magnetic resonance system, a computer program, and an electronically readable data carrier.

A method according to aspects of the disclosure for acquiring magnetic resonance data of an object under examination by means of a magnetic resonance system comprises the following steps:

In an excitation phase, applying an RF excitation pulse,
In a wait phase following the excitation phase, applying at least one first RF refocusing pulse after the applied RF excitation pulse according to a first echo spacing,
In an acquisition phase following the wait phase, applying at least two further RF refocusing pulses to generate echo signals according to a second echo spacing, wherein the second echo spacing is smaller than the first echo spacing,
Reading out the echo signals generated in the acquisition phase as magnetic resonance data from which image data can be reconstructed,
wherein in the wait phase at least two spoiler gradients are switched in the readout direction.

The spoiler gradients according to aspects of the disclosure allow flow-related artifacts and FID artifacts to be prevented without increasing the measurement time.

A magnetic resonance system according to aspects of the disclosure comprises a magnet unit, a gradient unit, a radiofrequency unit, and a control device designed to carry out a method according to aspects of the disclosure and having a spoiler gradient determining unit.

A computer program according to aspects of the disclosure implements a method according to aspects of the disclosure on a control device when it is executed on the control device.

The computer program can also be in the form of a computer program product directly loadable into a memory of a control device and having program code for carrying out a method according to aspects of the disclosure when the computer program product is executed in the computing unit of the computing system.

An electronically readable data carrier according to aspects of the disclosure is used to store electronically readable control information which comprises at least one computer program according to aspects of the disclosure and is designed to carry out a method according to aspects of the disclosure when the data carrier is used in a control device of a magnetic resonance system.

The advantages and embodiments disclosed with respect to the method apply analogously to the magnetic resonance system, the computer program product, and the electronically readable data carrier.

BRIEF DESCRIPTION OF THE DRAWINGS

Further advantages and details of the present disclosure will emerge from the exemplary embodiments described below and the associated drawings. The examples listed do not constitute a limitation of the disclosure.

DETAILED DESCRIPTION

Figure 1:
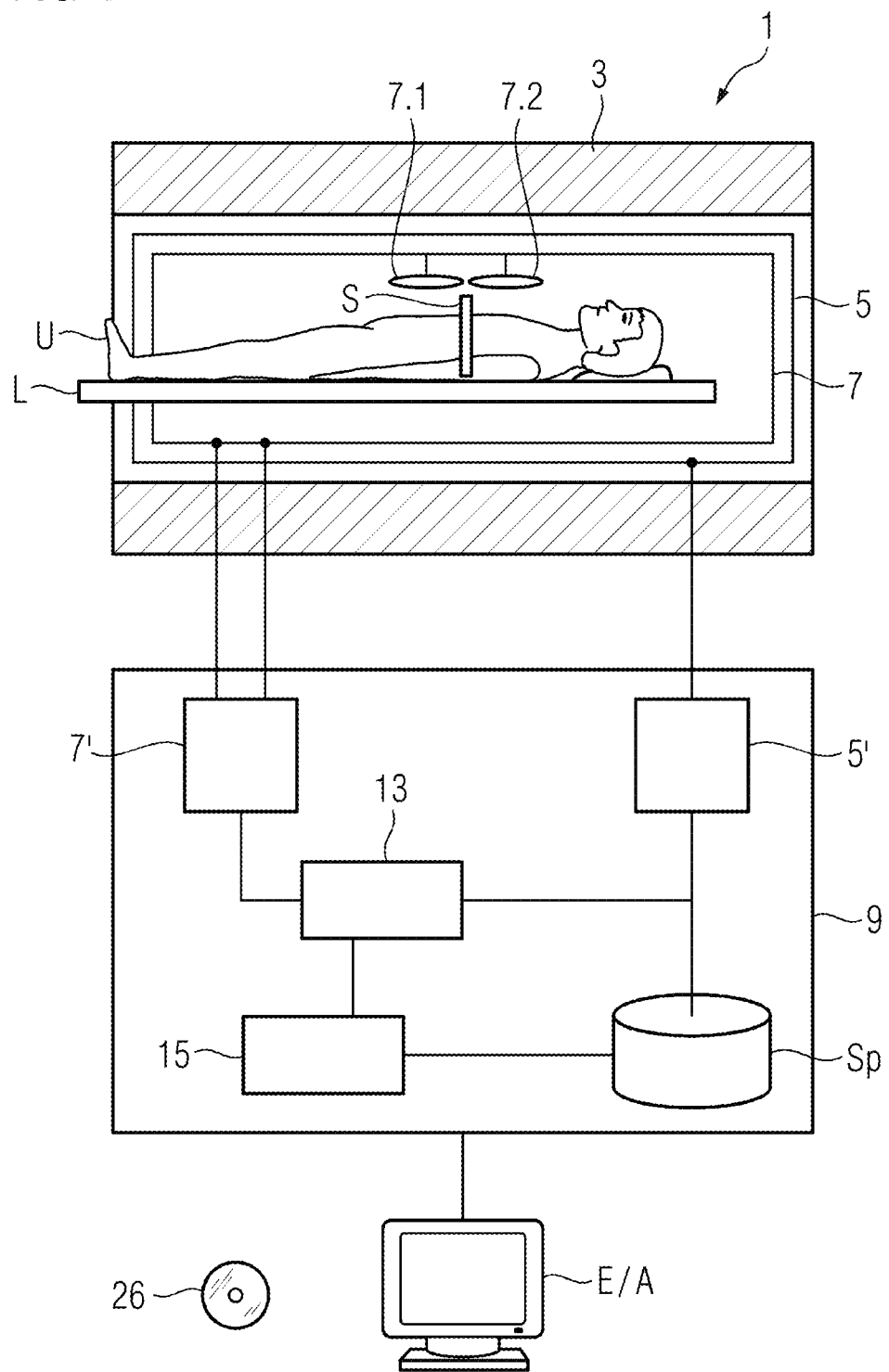
FIG. 1 schematically illustrates a magnetic resonance system according to aspects of the disclosure.

FIG. 1 shows a schematic representation of a magnetic resonance system 1 according to aspects of the disclosure. This comprises a magnet unit 3 for generating the main magnetic field, a gradient unit 5 for generating the gradient fields, a radiofrequency unit 7 for applying and receiving RF signals, and a control device 9 designed to carry out a method according to aspects of the disclosure.

In FIG. 1, these sub-units of the magnetic resonance system 1 are shown only in coarsely schematic form. In particular, the radiofrequency unit 7 can comprise a plurality of sub-units, e.g., a plurality of coils such as the coils 7.1 and 7.2 shown schematically, or more coils, which can be designed either only for transmitting radiofrequency signals or only for receiving the triggered radiofrequency signals, or for both.

In order to scan an object under examination U, e.g., a patient or also a phantom, the object under examination can be moved on a couch L into the magnetic resonance system 1 in the measurement volume thereof. The slice or slab S constitutes an exemplary target volume of the object under examination from which data is to be acquired and collected as measurement data.

The control device 9 is used to control the magnetic resonance system 1 and, in particular, can control the gradient unit 5 by means of a gradient controller 5' and the radiofrequency unit 7 by means of a radiofrequency transmit/receive controller 7'. The radiofrequency unit 7 can here comprise a plurality of channels on which signals can be transmitted or received.

The radiofrequency unit 7, together with its radiofrequency transmit/receive controller 7', is responsible for generating and applying (transmitting) an alternating RF field, also termed an RF pulse, for manipulating the spins in a region to be manipulated (e.g., in target volumes S to be measured) of the object U under examination. In this process, the center frequency of the alternating RF field, also referred to as the B1 field, is usually set as close as possible to the resonant frequency of the spins to be manipulated. Deviations of the center frequency from the resonant frequency are called off-resonance. To generate the B1 field, controlled currents are applied to the radiofrequency coils in the radiofrequency unit 7 by means of the RF transmit/receive controller 7'.

In addition, the control device 9 comprises a spoiler gradient determining unit 15 for determining spoiler gradients according to aspects of the disclosure, which can be implemented by the gradient controller 5'. The control device 9 is designed as a whole to carry out a method according to aspects of the disclosure.

A computing unit 13 incorporated in the control device 9 is designed to perform all the computing operations required for the necessary measurements and determinations. Intermediate results and results required for this purpose or determined in the process can be stored in a memory unit Sp of the control device 9. The units shown here are not necessarily to be understood as physically separate units, but merely represent a subdivision into notional entities that can also be implemented e.g., in fewer or even in only one physical unit.

Via an input/output device E/A of the magnetic resonance system 1, control commands can be fed to the magnetic resonance system, e.g., by a user, and/or results of the control device 9, such as, e.g., image data, can be displayed.

A method described herein can also be in the form of a computer program product which comprises a program and implements the described method on a control device 9 when it is executed on the control device 9. An electronically readable data carrier 26 having electronically readable control information stored thereon may also be present which comprises at least one such computer program product and is designed to carry out the described method when the data carrier 26 is used in a control device 9 of a magnetic resonance system 1.

Figure 2:
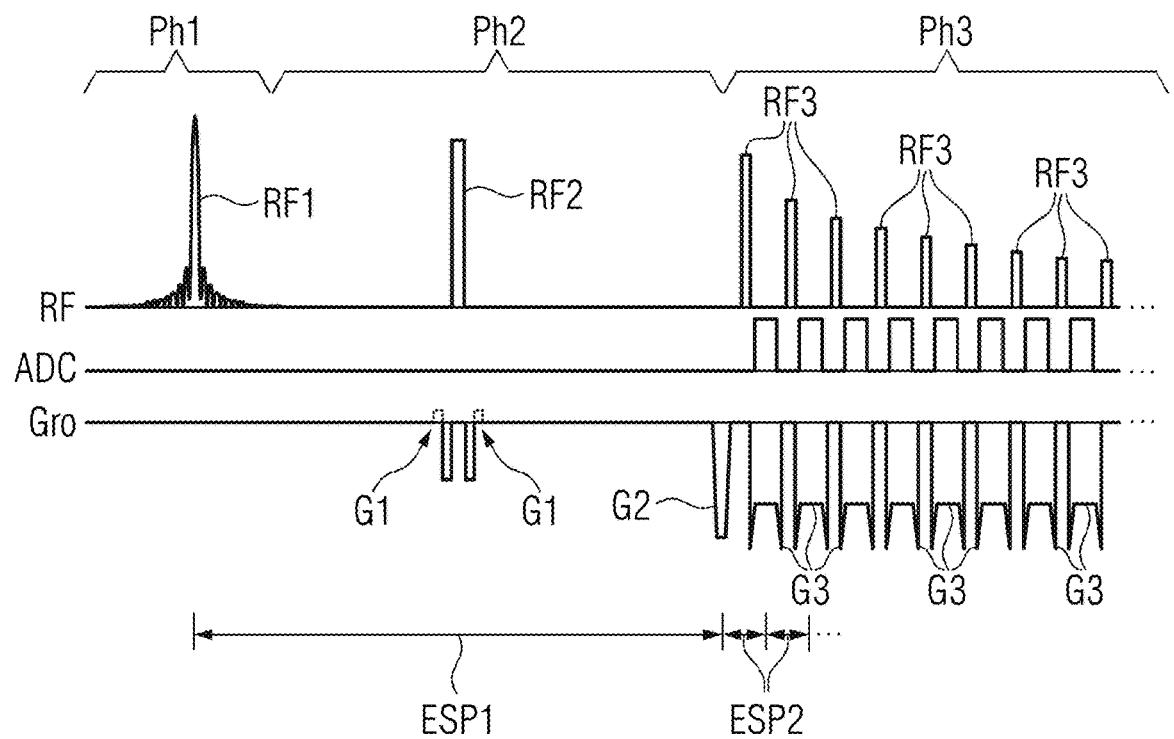
FIGS. 2-3 schematically illustrate parts of pulse sequence schemes for the acquisition of measurement data using spoiler gradients according to aspects of the disclosure.

FIG. 2 shows an example of a section of a pulse sequence scheme as can be used for the method according to aspects of the disclosure.

In FIG. 2, the timing of the RF pulses to be applied are shown in a first line RF.

In an excitation phase Ph1, an RF excitation pulse RF1 is applied. The RF excitation pulse RF1 can be e.g. a selectively exciting RF excitation pulse RF1.

In a wait phase Ph2 following the excitation phase Ph1, at least one first RF refocusing pulse RF2 is applied. The time interval between the RF excitation pulse RF1 and a subsequent first RF refocusing pulse RF2 is based on a first echo spacing ESP1, such that a first RF refocusing pulse generates an echo signal after a time corresponding to the first echo spacing ESP1 after the RF excitation pulse RF1.

In an acquisition phase Ph3 following the wait phase Ph2, at least two further RF refocusing pulses RF3 are applied. The further RF refocusing pulses RF3 generate echo signals with a time interval with respect to a last previously generated echo signal corresponding to the second echo spacing ESP2. The second echo spacing ESP2 is smaller than the first echo spacing ESP1. In this way, the load placed on the radiofrequency unit of the magnetic resonance system can be kept low.

The pulse sequence used can in particular be a pulse sequence of a three-dimensional turbo spin-echo imaging method, in particular a SPACE sequence, e.g., also a volume-selective excitation SPACE sequence, with variably adjustable flip angles of the further RF refocusing pulses RF3.

Echo signals generated in the acquisition phase Ph3 are read out as magnetic resonance data from which image data can be reconstructed. The echo signals are read out in each case in a readout window associated with an echo signal. The timing of the readout windows is represented by blocks in the ADC line.

Of the gradients to be switched, only the gradients to be switched in the readout direction are shown in the Gro line. The other gradients to be switched in the slice selection direction and phase encoding direction can be switched in a known manner.

The readout gradients G3 switched in the acquisition phase Ph3 have a constant amplitude section coinciding with the readout windows.

In the wait phase Ph2, at least two spoiler gradients G1 are switched in the readout direction to prevent artifacts.

The spoiler gradients G1 switched in the wait phase Ph2 have a vanishing zeroth moment overall, i.e., the zeroth moment accumulated by the gradients switched in the wait phase Ph2 is zero at the beginning of the acquisition phase Ph3. In this way, the switched spoiler gradients G1 do not negatively affect the subsequent readout of the echo signals.

The spoiler gradients G1 switched in the wait phase Ph2 can be switched with the maximum slew rate of the magnetic resonance system used, so that they reach their maximum amplitude as quickly as possible and also return to zero as quickly as possible. The duration of a spoiler gradient G1 switched in the wait phase Ph2 can therefore be kept as short as possible. However, if there is sufficient time in the pulse sequence scheme for longer spoiler gradients G1, a lower slew rate can also be used to reduce the load placed on the gradient unit and, if necessary, to reduce eddy currents.

The spoiler gradients G1 switched in the wait phase Ph2 can be switched immediately before and/or after a first RF refocusing pulse RF2. A spoiler gradient can therefore be switched immediately before or after a first RF refocusing pulse RF2, or spoiler gradients G1 can be switched both before and after a first RF refocusing pulse RF2. The proximity in time of the spoiler gradients G1 to a first RF refocusing pulse RF2 improves the effect of the spoiler gradients.

In particular, a spoiler gradient G1 can be switched before and after each first RF refocusing pulse RF2 in the wait phase Ph2 in order to maximize the spoiler effect.

The spoiler gradients G1 switched before and after a first RF refocusing pulse (RF2) can in particular have the same form, i.e., the shape, duration, maximum amplitude and slew rate of a spoiler gradient G1 switched immediately before a first RF refocusing pulse RF2 is identical to the shape, duration, maximum amplitude and slew rate of a spoiler gradient G1 switched immediately after the first RF refocusing pulse RF2. As a result, the zeroth moment accumulated by the spoiler gradients G1 switched before and after the first RF refocusing pulse RF2 vanishes.

In addition to the constant amplitude section already mentioned, the readout gradients G3 switched in the acquisition phase Ph3 can additionally have spoiler gradients before and after the constant amplitude section as exemplified by the two "peaks" of the readout gradients G3 in FIG. 2.

These spoiler gradients switched in the readout direction during the acquisition phase Ph3 immediately before and after an acquisition window (ADC) have a zeroth moment. Advantageously, the zeroth moment of a spoiler gradient G1 switched in the wait phase Ph2 can be equal to the zeroth moment of a spoiler gradient switched in the acquisition phase Ph3. In this way, FID artifacts can be eliminated particularly efficiently.

The spoiler gradients G1 switched in the wait phase Ph2 can be designed to have a vanishing first moment overall. Thus, the first moment accumulated by the spoiler gradients G1 switched in the wait phase Ph2 as a whole is also zero. This enables flow-related artifacts to be prevented. The spoiler gradients G1 switched in the wait phase Ph2 can be bipolar for this purpose, i.e., have amplitudes of both polarizations.

At an echo time between a first RF refocusing pulse RF2 and a first further RF refocusing pulse RF3, a dephasing gradient G2 can be switched in the readout direction. Such a dephasing gradient switched just before a train of echo signals generated in the acquisition phase Ph3 can further reduce flow-related artifacts. Here, the zeroth moment of the dephasing gradient G2 advantageously corresponds to half the zeroth moment of a readout gradient G3. In this way, the central echo of the echo signals acquired in a readout phase Ph3 during a constant readout gradient G3 is also centrally located in the readout blocks ADC, and the k-space is sampled symmetrically in the readout window.

Figure 3:
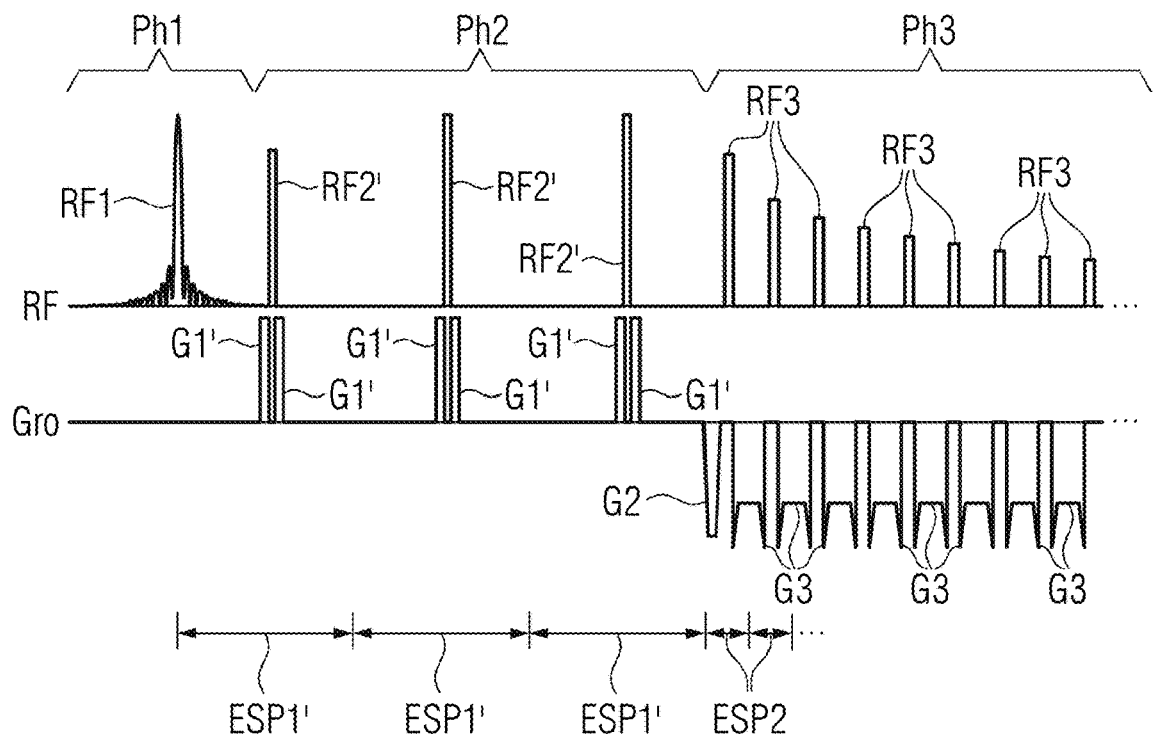

FIG. 3 shows another example of a section of a pulse sequence scheme such as can be used for the method according to aspects of the disclosure.

In contrast to FIG. 2, changes have only been made in the wait phase Ph2, for which reason the line ADC has been omitted for the sake of clarity, and the same reference characters have been used.

In the wait phase Ph2 following the excitation phase Ph1, a plurality of, in this case three, first RF refocusing pulses RF2' are applied. The time interval between the RF excitation pulse RF1 and a subsequent first RF refocusing pulse RF2' being applied is again based on a first echo spacing ESP1' such that a first RF refocusing pulse RF2' generates an echo signal after a time corresponding to the first echo spacing ESP1' after the RF excitation pulse RF1. Here, the echo signal generated by the first RF refocusing pulse RF2' is refocused two more times by the following first RF refocusing pulses RF2' before the acquisition phase Ph3 begins.

The first echo spacing ESP' is again smaller than the second echo spacing ESP2. In this way, the load placed on the RF unit of the magnetic resonance system can be reduced. By using a plurality of first RF refocusing pulses RF2', the signal-to-noise ratio (SNR) can be improved, and possible motion or diffusion effects can be reduced.

For the spoiler gradients G1' switched in the wait phase Ph2, the same applies as described for FIG. 2.

The spoiler gradients G1, G1' according to the disclosure can efficiently reduce both FID artifacts and flow artifacts.

The invention claimed is:

1. A method for acquiring magnetic resonance data of an object under examination by means of a magnetic resonance system having a magnet unit, a gradient unit, a radiofrequency unit, a controller, a memory, and a display, the method comprising:
   in an excitation phase, the radiofrequency unit applying an RF excitation pulse;
   in a wait phase following the excitation phase, the radiofrequency unit applying at least a first RF refocusing pulse after the applied RF excitation pulse according to a first echo spacing;
   in an acquisition phase following the wait phase, the radiofrequency unit applying at least two further RF refocusing pulses to generate echo signals according to a second echo spacing, wherein the second echo spacing is smaller than the first echo spacing; and
   the controller reading out the echo signals generated in the acquisition phase as magnetic resonance data from which image data can be reconstructed and then stored in the memory or displayed on the display,
   wherein in the wait phase at least two spoiler gradients are switched in the readout direction.

2. A magnetic resonance system, comprising:
   a magnet unit;
   a gradient unit;
   a radiofrequency unit; and
   a controller incorporating a radiofrequency transmit/receive control and a spoiler gradient determining unit, wherein the controller is designed to carry out a method for acquiring magnetic resonance data of an object under examination on the magnetic resonance system, wherein the method comprises:
   in an excitation phase, the radiofrequency unit applying an RF excitation pulse;
   in a wait phase following the excitation phase, the radiofrequency unit applying at least a first RF refocusing pulse after the applied RF excitation pulse according to a first echo spacing;
   in an acquisition phase following the wait phase, the radiofrequency unit applying at least two further RF refocusing pulses to generate echo signals according to a second echo spacing, wherein the second echo spacing is smaller than the first echo spacing; and
   the controller reading out the echo signals generated in the acquisition phase as magnetic resonance data from which image data can be reconstructed and then stored in the memory or displayed on the display,
   wherein in the wait phase at least two spoiler gradients are switched in the readout direction.

3. A non-transitory electronically readable data carrier having electronically readable control information stored thereon, comprising at least one computer program designed to carry out a method for acquiring magnetic resonance data of an object under examination when the data carrier is used in a control device of a magnetic resonance system, wherein the method comprises:
   in an excitation phase, a radiofrequency unit applying an RF excitation pulse;
   in a wait phase following the excitation phase, the radiofrequency unit applying at least a first, RF refocusing pulse after the applied RF excitation pulse according to a first echo spacing;
   in an acquisition phase following the wait phase, the radiofrequency unit applying at least two further RF refocusing pukes to generate echo signals according to a second echo spacing, wherein the second echo spacing is smaller than the first echo spacing; and
   the control device reading out the echo signals generated in the acquisition phase as magnetic resonance data from which image data can be reconstructed and then stored in the memory or displayed on the display,
   wherein in the wait phase at least two spoiler gradients are switched in the readout direction.

4. The method of claim 1, wherein spoiler gradients switched in the wait phase have a vanishing zeroth moment overall such that the zeroth moment accumulated by the at least two spoiler gradient switched in the wait phase is zero at the beginning of the acquisition phase.

5. The method of claim 1, wherein spoiler gradients switched in the wait phase are switched with a maximum slew rate.

6. The method of claim 1, wherein spoiler gradients switched in the wait phase are switched immediately prior to and/or after a first RF refocusing pulse.

7. The method of claim 1, wherein in the wait phase a spoiler gradient is switched prior to and after each first RF refocusing pulse.

8. The method of claim 7, wherein spoiler gradients switched in the wait phase prior to and after a first RF refocusing pulse are of identical form.

9. The method of claim 1, wherein spoiler gradients are switched in the readout direction in the acquisition phase immediately prior to and after an acquisition window, and wherein the zeroth moment of a spoiler gradient switched in the wait phase is equal to the zeroth moment of a spoiler gradient switched in the acquisition phase.

10. The method of claim 1, wherein spoiler gradients switched in the wait phase have a vanishing first moment overall.

11. The method of claim 1, wherein a dephasing gradient is switched in the readout direction at an echo time between a first RF refocusing pulse and a first further RF refocusing pulse.

* * * * *